United States Patent
Carl et al.

(10) Patent No.: US 6,436,267 B1
(45) Date of Patent: Aug. 20, 2002

(54) METHOD FOR ACHIEVING COPPER FILL OF HIGH ASPECT RATIO INTERCONNECT FEATURES

(75) Inventors: Daniel A. Carl, Pleasanton; Barry Chin, Saratoga; Liang Chen, San Jose; Robin Cheung, Cupertino; Peijun Ding, San Jose; Yezdi Dordi, Palo Alto; Imran Hashim, San Jose; Peter Hey, Sunnyvale; Ashok K. Sinha, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/650,108

(22) Filed: Aug. 29, 2000

(51) Int. Cl.$^7$ .......................... C23C 28/02; C25D 5/02; C25D 11/32
(52) U.S. Cl. .................... 205/186; 205/123; 205/157
(58) Field of Search ............................ 205/186, 123, 205/157

(56) References Cited

U.S. PATENT DOCUMENTS

| | | | |
|---|---|---|---|
| 3,649,509 A | 3/1972 | Morawetz et al. | 204/238 |
| 3,770,598 A | 11/1973 | Creutz | 204/52 R |
| 4,110,176 A | 8/1978 | Creutz et al. | 204/52 R |
| 4,326,940 A | 4/1982 | Eckles et al. | 204/232 |
| 4,336,114 A | 6/1982 | Mayer et al. | 204/52 R |
| 4,376,685 A | 3/1983 | Watson | 204/52 R |

(List continued on next page.)

FOREIGN PATENT DOCUMENTS

| | | |
|---|---|---|
| EP | 0520519 A1 | 12/1992 |
| JP | 61-270394 A * | 11/1986 |
| JP | 63118093 | 5/1988 |
| JP | 04280993 | 10/1992 |
| JP | 10041389 | 2/1998 |

OTHER PUBLICATIONS

"Tantalum, Copper and Damascene: The Future of Interconnects", Singer P., Semiconductor International, Jun. 1998, 6 pages.
"Wafer Processing", Singer, P., Semiconductor International, Jun. 1998, p. 70.
"Handbook of Deposition Technologies for Films and Coatings", Bunshah, R., Science, Technology and Applications, Second Edition, University of Calif., at Los Angeles, Calif., 5 pages. No date avail.
"Encapsulated copper interconnection device5 using sidewall barriers", Gardner, D., et al., Thin Solid Films 262, 1995 pp. 104–119. No date available.
"Tantalum and niobium as a diffusion barrier between copper and silicon", Jang, S., et al., Journal of Materials Science Materials in Electronics, 1996, pp. 271–278. No month available.
"Electroless copper deposition for ULSI", Diamand, Y., et al., Thin Solid Films 262, 1995, pp. 93–103. No date available.

(List continued on next page.)

*Primary Examiner*—Edna Wong
(74) *Attorney, Agent, or Firm*—Moser, Patterson & Sheridan LLP

(57) ABSTRACT

One aspect of the invention provides a consistent metal electroplating technique to form void-less metal interconnects in sub-micron high aspect ratio features on semiconductor substrates. One embodiment of the invention provides a method for filling sub-micron features on a substrate, comprising reactive precleaning the substrate, depositing a barrier layer on the substrate using high density plasma physical vapor deposition; depositing a seed layer over the barrier layer using high density plasma physical vapor deposition; and electro-chemically depositing a metal using a highly resistive electrolyte and applying a first current density during a first deposition period followed by a second current density during a second period.

35 Claims, 8 Drawing Sheets

U.S. PATENT DOCUMENTS

| | | | |
|---|---|---|---|
| 4,435,266 A | | 3/1984 | Johnston ..................... 204/276 |
| 4,789,445 A | | 12/1988 | Goffman et al. ............. 204/114 |
| 5,039,381 A | | 8/1991 | Mullarkey ................. 204/47.5 |
| 5,055,425 A | | 10/1991 | Leibovitz et al. ............ 437/195 |
| 5,092,975 A | | 3/1992 | Yamamura et al. ......... 204/198 |
| 5,174,886 A | * | 12/1992 | King et al. ................. 205/125 |
| 5,178,739 A | | 1/1993 | Barnes et al. .......... 204/192.12 |
| 5,232,871 A | | 8/1993 | Ho ............................. 437/190 |
| 5,256,274 A | | 10/1993 | Poris .......................... 205/123 |
| 5,308,793 A | | 5/1994 | Taguchi et al. ............. 437/194 |
| 5,316,974 A | | 5/1994 | Crank ......................... 437/190 |
| 5,328,589 A | | 7/1994 | Martin ....................... 205/296 |
| 5,354,712 A | | 10/1994 | Ho et al. .................... 437/195 |
| 5,371,042 A | | 12/1994 | Ong ............................ 437/194 |
| 5,486,492 A | | 1/1996 | Yamamoto et al. .......... 437/192 |
| 5,516,412 A | | 5/1996 | Andricacos et al. .... 204/224 R |
| 5,534,460 A | | 7/1996 | Tseng et al. ................ 437/187 |
| 5,607,542 A | | 3/1997 | Wu et al. ................ 156/643.1 |
| 5,613,296 A | | 3/1997 | Kurino et al. ................ 29/852 |
| 5,654,232 A | | 8/1997 | Gardner ...................... 438/661 |
| 5,660,682 A | | 8/1997 | Zhao et al. .................. 438/715 |
| 6,110,346 A | | 8/2000 | Reid et al. ................... 205/157 |
| 6,140,241 A | * | 10/2000 | Shue et al. .................. 438/692 |
| 6,174,425 B1 | * | 1/2001 | Simpson et al. .............. 205/96 |
| 6,187,682 B1 | * | 2/2001 | Denning et al. ............ 438/694 |

OTHER PUBLICATIONS

"Electromigration Failure Distributions for Multi–layer Interconnects as a Function of Line Width: Experiments and Simulation", Brown, D., et al., Mat.Res.Soc.Symp.Proc. vol. 427, 1996, pp. 107–112. No month available.

"Barrier Metal Free Copper Damascene Interconnection Technology Using Atmospheric Copper Reflow and Nitrogen Doping in SiOF Film", Mikagi, K., et al., ULSI Device Development Lab., NEC Corp., Japan, 1996, pp. 365–368. No month available "Electromigration and Diffusion in Pure Cu and Cu(Sn) Alloys", Hu, et al., 7 pages. No date available.

"An Amorphous Ti–Si–N Diffusion Barrier Layer for Cu Interconnections", Iijima, T., et al., ULSI Research Lab., R&D Center, Toshiba Corp., Japan, 1996, pp. 67–74. No month available.

Lowenheim, "Electroplating" (c. 1978), p. 418. no month available.*

Lowenheim, "Electroplating" (c. 1978), p. 418. no month available.

* cited by examiner

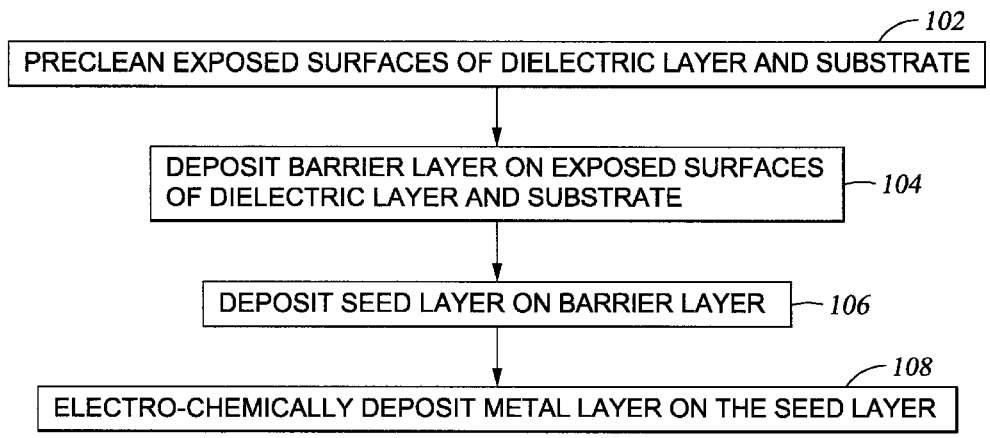
Fig. 1
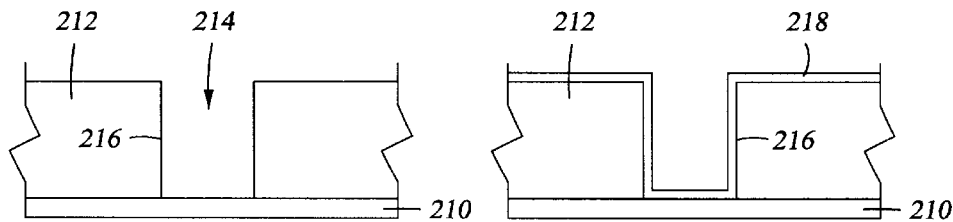
Fig. 2A     Fig. 2B
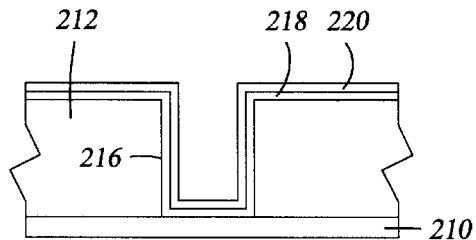 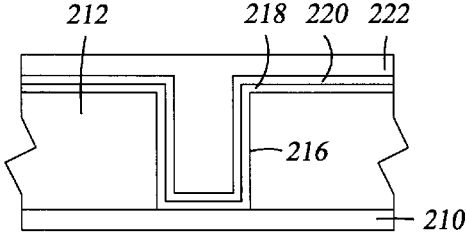
Fig. 2C     Fig. 2D
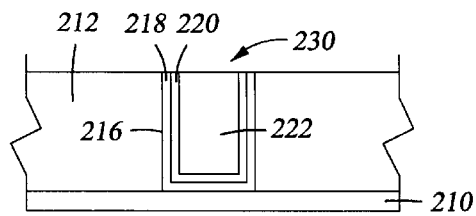
Fig. 2E

METHOD FOR ACHIEVING COPPER FILL OF HIGH ASPECT RATIO INTERCONNECT FEATURES

BACKGROUND OF THE INVENTION

1. Field of the Invention

The invention generally relates to semiconductor processing. More particularly, the invention relates to metallization of sub-micron interconnect features on a substrate.

2. Background of the Related Art

Copper has become a choice metal for filling sub-micron, high aspect ratio interconnect features on substrates as circuit densities increase for the next generation of ultra large scale integration because copper and copper alloys have lower resistivity than aluminum and significantly higher electromigration resistance as compared to aluminum. These characteristics are important for supporting the higher current densities experienced at high levels of integration and increased device speed.

The aspect ratios for the features, i.e., the ratio for the feature height to the feature width, increases with the higher level of integration. Many traditional deposition processes have difficulty filling structures or features having sub-micron width where the aspect ratio exceeds 4:1, and particularly where the ratio exceeds 10:1. Thus, there is a great amount of ongoing effort being directed at the formation of void-free sub-micron features having high aspect ratios.

Despite the desirability of using copper for semiconductor device fabrication, choices of fabrication methods for depositing copper into very high aspect ratio features are limited because common chemical vapor deposition processes and physical vapor deposition processes have provided unsatisfactory results in forming void-free sub-micron features having high aspect ratios. Furthermore, the vapor deposition processes can be costly. As a result, electroplating or electrochemical deposition is becoming an accepted method for copper metallization of interconnect features on semiconductor devices.

Metal electroplating in general is a well known art and can be achieved by a variety of techniques. Present designs of cells for electroplating a metal onto a substrate are generally based on a fountain plater configuration. In the fountain plater configuration, the semiconductor substrate is positioned above a cylindrical electrolyte container with the plating surface facing an opening of the cylindrical electrolyte container. The electrolyte is pumped to flow upwardly and contact the substrate plating surface. The substrate is electrically biased and connected as the cathode of the plating system, and the surfaces to be plated are electrically connected to the cathode power source to provide the electrical current that induces the metal ions in the plating solution to deposit onto the exposed conductive surface of the substrate. An anode is typically disposed in the electrolyte and electrically biased to attract the negatively charged counterparts of the metal ions in the electrolyte. The fountain plater is generally adequate for electroplating large, low aspect ratio features (i.e., larger than micrometer-sized and lower than 1:1 height to width ratio). However, a number of obstacles impair consistent electroplating of copper onto substrates having sub-micron high aspect ratio features.

First, a continuous metal seed layer is essential for conducting the current required to the surfaces to be plated by the electroplating process. When a discontinuity is present in the metal seed layer, the portion of the seed layer that is not electrically connected to the bias power supply does not receive deposition during the electroplating process. Currently practiced physical vapor deposition methods encounters difficulty in forming a continuous, uniform seed layer within a sub-micron high aspect ratio feature. The seed layer tends to become discontinuous on the sidewall surfaces and the bottom surface of the feature because of the difficulty in depositing into the narrow (i.e., nanometer-sized) aperture width of the feature. The discontinuities in the seed layer prevent proper electroplating of metal onto the seed layer, resulting in defective devices on the processed substrate.

Second, it has been difficult to deposit into sub-micron high aspect ratio features without forming voids in the feature because the horizontal electroplated metal growth tends to close off the feature at the aperture opening before the feature has been completely filled, resulting in a void forming within the feature. A void formation in the feature changes the material and operating characteristics of the interconnect feature, such as decreasing electromigration resistance, and typically causes improper operation and premature breakdown of the device. To reduce void formation in a high aspect ratio feature, the upper corners at the feature opening are typically rounded off by an etching process. However, the additional etching step to round-off corners of features increases the processing time for each substrate and reduces throughput of the system. Furthermore, voids may still form within the features during the deposition process even with rounded corners at the feature opening.

Third, currently practiced electroplating methods have not provided consistent electroplating results between sequentially processed substrate in a single run. Also, the material properties of the electroplated metal layer, such as grain size, orientation, reflectivity and resistance, are not sufficiently uniform across the deposited substrate surface of a single substrate when processed with typical electroplating systems.

Therefore, there is a need for a consistent metal electroplating technique to form void-less metal interconnects in sub-micron high aspect ratio features on semiconductor substrates. Particularly, there is a need for a method for preparing a substrate prior to electroplating that overcomes the problems presented by currently practiced seed layers used in electroplating and reduces the formation of defective devices. There is also a need for a method for electroplating a metal into sub-micron high aspect ratio feature that provides consistent electroplating results between sequentially processed substrate and uniform material properties of the electroplated metal layer across the deposited substrate surface on a single substrate.

SUMMARY OF THE INVENTION

One aspect of the invention provides a consistent metal electroplating technique to form void-less metal interconnects in sub-micron high aspect ratio features on semiconductor substrates. Another aspect of the invention provides a method for preparing a substrate prior to electroplating that overcomes the problems presented by currently practiced seed layers used in electroplating and reduces the formation of defective devices. Another aspect of the invention provides a method for electroplating a metal into sub-micron high aspect ratio feature that provides consistent electroplating results between sequentially processed substrate and uniform material properties of the electroplated metal layer across the deposited substrate surface on a single substrate.

One embodiment of the invention provides a method for filling sub-micron features on a substrate, comprising reactive precleaning the substrate, depositing a barrier layer on the substrate using high density plasma physical vapor deposition; depositing a seed layer over the barrier layer using high density plasma physical vapor deposition; and electro-chemically depositing a metal using a highly resistive electrolyte and applying a first current density during a first deposition period followed by a second current density during a second period.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 1 is a flow chart illustrating one embodiment of a method for forming an interconnect feature on a semiconductor substrate according to the invention.

FIGS. 2A–E are partial cross sectional views of a substrate illustrating one embodiment of a method for forming an interconnect feature on a semiconductor substrate according to the invention.

DETAILED DESCRIPTION OF THE PREFERRED EMBODIMENT

Figure 3:
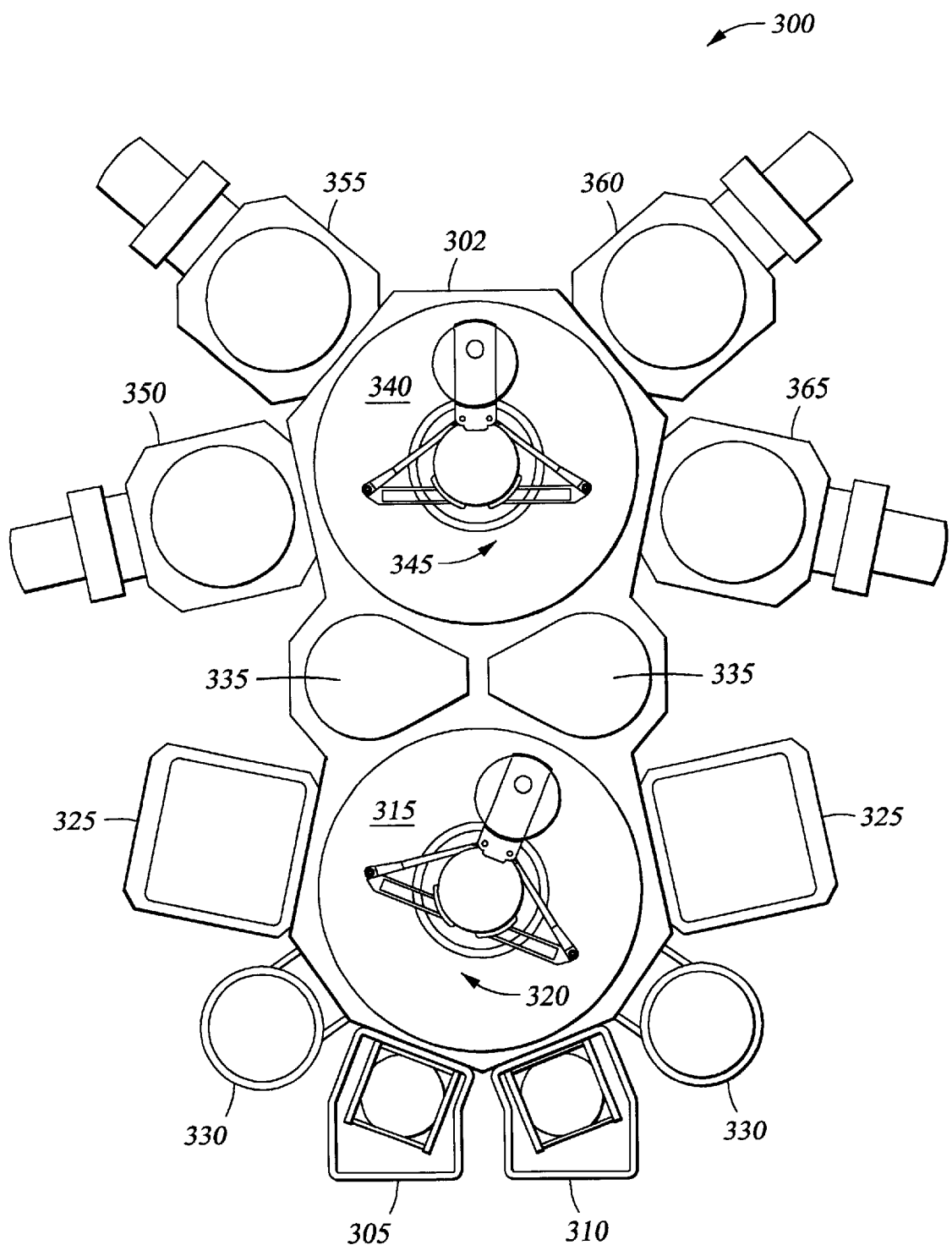
FIG. 3 is a schematic view of a processing system incorporating one or more pre-clean chambers and one or more PVD chambers.

FIG. 1 is a flow chart illustrating one embodiment of a method for forming an interconnect feature on a semiconductor substrate according to the invention. The method 100 for forming an interconnect on a semiconductor substrate according to the invention provides consistent results between sequentially processed substrate and uniform material properties across the deposited substrate surface on a single substrate. FIGS. 2A–E are partial cross sectional views of a substrate illustrating one embodiment of a method for forming an interconnect feature on a semiconductor substrate according to the invention. Prior to performing the metallization process according to the invention, a substrate 210 having a dielectric layer 212 formed thereon is patterned (e.g., lithography process) and etched to form interconnect features 214 to be filled with metal. The dielectric layer 212 may be etched to form interconnect features 214 having substantially vertical sidewalls (i.e., without rounding off corners of the interconnect features). The etching process may be performed in an etch chamber such as the IPS Etch chamber available from Applied Materials, Inc., of Santa Clara, Calif.

Referring to FIGS. 1 and 2A–2E, the method generally comprises: reactively pre-cleaning the exposed surfaces 216 (step 102 and FIG. 2A), depositing a barrier layer 218 over the substrate surface utilizing high density plasma physical vapor deposition (HDP-PVD) techniques (step 104 and FIG. 2B), depositing a seed layer 220 over the barrier layer 218 utilizing HDP-PVD techniques (step 106 and FIG. 2C), and electroplating a metal layer 222 on the seed layer utilizing a highly resistive electrolyte (step 108 and FIG. 2D). The electroplated metal layer may be planarized, such as by chemical mechanical polishing (CMP), to define a conductive interconnect feature 230, as shown in FIG. 2E, and further processing may be performed on the substrate to complete fabrication of the integrated circuit. Although a via structure is shown in FIGS. 2A–2E, it is understood that embodiments of the invention are useful for forming various types of interconnect features, such as lines, contacts, dual damascene structures and other features.

The pre-clean process (step 102), the barrier layer deposition process (step 104), and the seed layer process (step 106) may be performed on a processing system having pre-clean chambers and deposition chambers. FIG. 3 is a schematic view of a processing system incorporating one or more pre-clean chambers and one or more PVD chambers. The processing system 300 is a two-staged vacuum processing system defined by a mainframe or platform 302 having a plurality of modules or chamber attached thereto. An example of a commercial embodiment of a two-staged vacuum processing platform is the Endura® platform, available from Applied Materials, Inc., Santa Clara, Calif., which is described in U.S. Pat. No. 5,186,718, Tepman et al., hereby incorporated by reference in its entirety. Other examples of processing systems useful for the present invention include the Centura®, the Endura®, the Producer® and the P5000® systems available from Applied Materials, Inc., Santa Clara, Calif.

The processing system 300 includes vacuum load-lock chambers 305 and 310 attached to a first stage transfer chamber 315. The load-lock chambers 305 and 310 maintain vacuum conditions within the first stage transfer chamber 315 while substrates enter and exit the processing system 300. A first robot 320 transfers substrates between the load-lock chambers 305 and 310 and one or more substrate processing chambers 325 and 330 attached to the first stage transfer chamber 315. Processing chambers 325 and 330 can be configured to perform a number of substrate processing operations, such as chemical vapor deposition (CVD), physical vapor deposition (PVD), etch, pre-clean, degas, orientation and other substrate processes. The first robot 320 also transfers substrates to/from one or more transfer chambers 335 disposed between the first stage transfer chamber 315 and a second stage transfer chamber 340.

The transfer chambers 335 are used to maintain ultrahigh vacuum conditions in the second stage transfer chamber 340 while allowing substrates to be transferred between the first stage transfer chamber 315 and the second stage transfer chamber 340. A second robot 345 transfers substrates between the transfer chambers 335 and a plurality of substrate processing chambers 350, 355, 360 and 365. Similar to processing chambers 325 and 330, each of the processing chambers 350 to 365 can be configured to perform a variety of substrate processing operations. For example, the processing chamber 350 may be a CVD chamber configured to deposit a dielectric film; the processing chamber 355 may be an etch chamber configured to etch apertures or openings in a dielectric film for forming interconnect features; the processing chamber 360 may be a PVD chamber configured to deposit a barrier film; and the processing chamber 365 may be a PVD chamber configured to deposit a metal film. A plurality of processing systems/platforms may be required to perform all of the processes required to complete manufacturing of an integrated circuit or chip. One embodiment of the process system includes one PVD chamber configured to deposit barrier layers and two PVD chambers configured to deposit seed layers.

A controller (not shown) may control the overall operation of the processing system 300 and the individual processes performed in each of the substrate processing chambers. The controller may include a microprocessor or computer (not shown) and a computer program executed by a microprocessor or computer. Substrates are brought to vacuum load-lock chambers 305 and 310 by a conveyor belt or robot system (not shown) controlled by the controller. The robots 320 and 345 are also operated by the controller to transfer substrates between the various processing chambers of the processing system 300. Additionally, the controller may control and/or coordinate with other components or systems connected to the processing system 300.

An example of a processing system for preparing a substrate for an electrochemical deposition process is the Endura® Electra™ Barrier and Seed System, available from Applied Materials, Inc., Santa Clara, Calif. Although one specific configuration of the preparation processing system is described below, the inventors contemplate utilizing a variety of configurations to perform the individual processes according to the invention.

Figure 4:
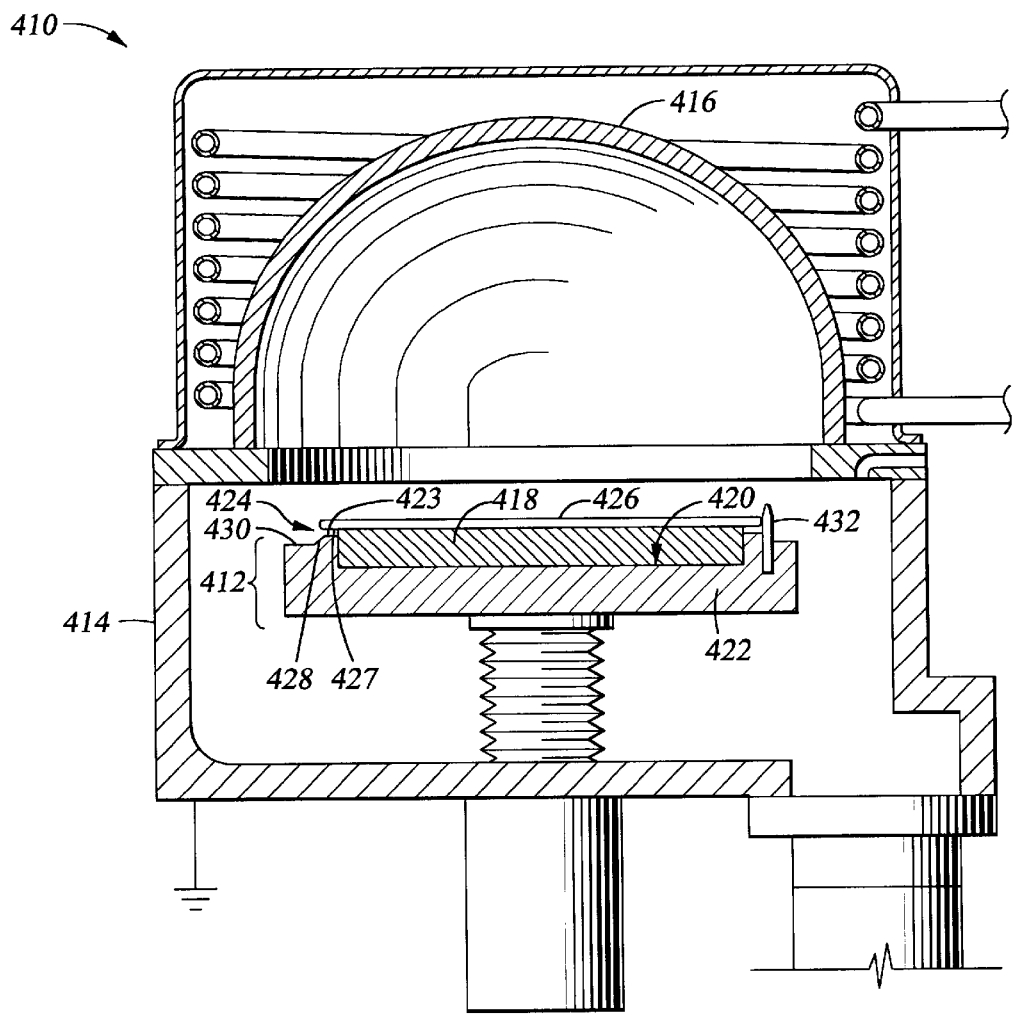
FIG. 4 is a cross sectional view of a pre-clean chamber.

Referring back to FIG. 1, the exposed surfaces of the substrate is pre-cleaned in step 102 prior to deposition of the barrier layer and seed layer onto the substrate. The processing system 300 includes one or more pre-clean chambers. FIG. 4 is a cross sectional view of a pre-clean chamber. Generally, the pre-clean chamber 410 has a substrate support member 412 disposed in a chamber enclosure 414 under a quartz dome 416. The substrate support member 412 includes a central pedestal plate 418 disposed within a recess 420 on a quartz insulator plate 422. The upper surface of the central pedestal plate 418 typically extends above the upper surface of the quartz insulator plate 422. A gap 424, typically between about 5 mils and 15 mils, is formed between a bottom surface of the substrate 426 and the top surface of the quartz insulator plate 422. During processing, the substrate 426 is placed on the central pedestal plate 418 and located thereon by positioning pin 432. The peripheral portion of the substrate 426 extends over the quartz insulator plate 422 and overhangs the upper edge of the quartz insulator plate 422. A beveled portion 428 of the quartz insulator plate 422 is disposed below this overhanging peripheral portion of the substrate 426, and a lower annular flat surface 430 extends from the lower outer edge of the beveled portion 428. The insulator plate 422 and the dome 416 may comprise other dielectric materials, such as aluminum oxide and silicon nitride, and the insulator plate 422 and the dome 416 are typically parts of a process kit that system operators periodically replace during routine maintenance.

The process for pre-cleaning the substrate 426 in the pre-clean chamber 410 may involve a reactive process and/or a sputter-etching process using the substrate 426 as the sputtering target. Generally, the reactive pre-clean process (step 104) may be performed on the substrate by introducing a pre-clean gas mixture comprising hydrogen (between about 0% and about 10%) and helium (between about 90% and about 100%) into the chamber and providing RF power (between about 300 W and about 600 W at about 1 to 4 MHz) to a plasma generation coil. The substrate support may be biased between about 10 and 100 W. The chamber pressure may be maintained between about 40 mTorr and 200 mTorr during the pre-clean process. The reactive pre-clean process may be carried out for between about 30 seconds and 120 seconds. After the pre-clean process, the substrate is transferred to a high density plasma physical vapor deposition chamber for deposition of a barrier layer and a seed layer over the surfaces of the substrate.

In one embodiment of the invention, the reactive pre-clean process (step 104) is performed on the substrate by introducing a pre-clean gas mixture comprising 5% hydrogen and 95% helium into the chamber and providing RF power to a coil at about 450 W at about 2.0 MHz. The substrate support is biased at about 40 W. The chamber pressure is maintained at about 80 mTorr during the pre-clean process. The reactive pre-clean process is carried out for about 60 seconds. After the pre-clean process, the substrate is transferred to a high density plasma physical vapor deposition chamber for deposition of a barrier layer (step 104) and a seed layer (step 106) over the surfaces of the substrate.

Referring back to FIG. 3, the processing system includes one or more physical vapor deposition (PVD) chambers configured to deposit barrier layers and one or more PVD chambers configured to deposit seed layers. To enhance efficiency and throughput of the system, one configuration of the processing system includes one physical vapor deposition (PVD) chamber configured to deposit barrier layers and two PVD chambers configured to deposit seed layers disposed in connection to the back-end central transfer chamber.

Figure 5:
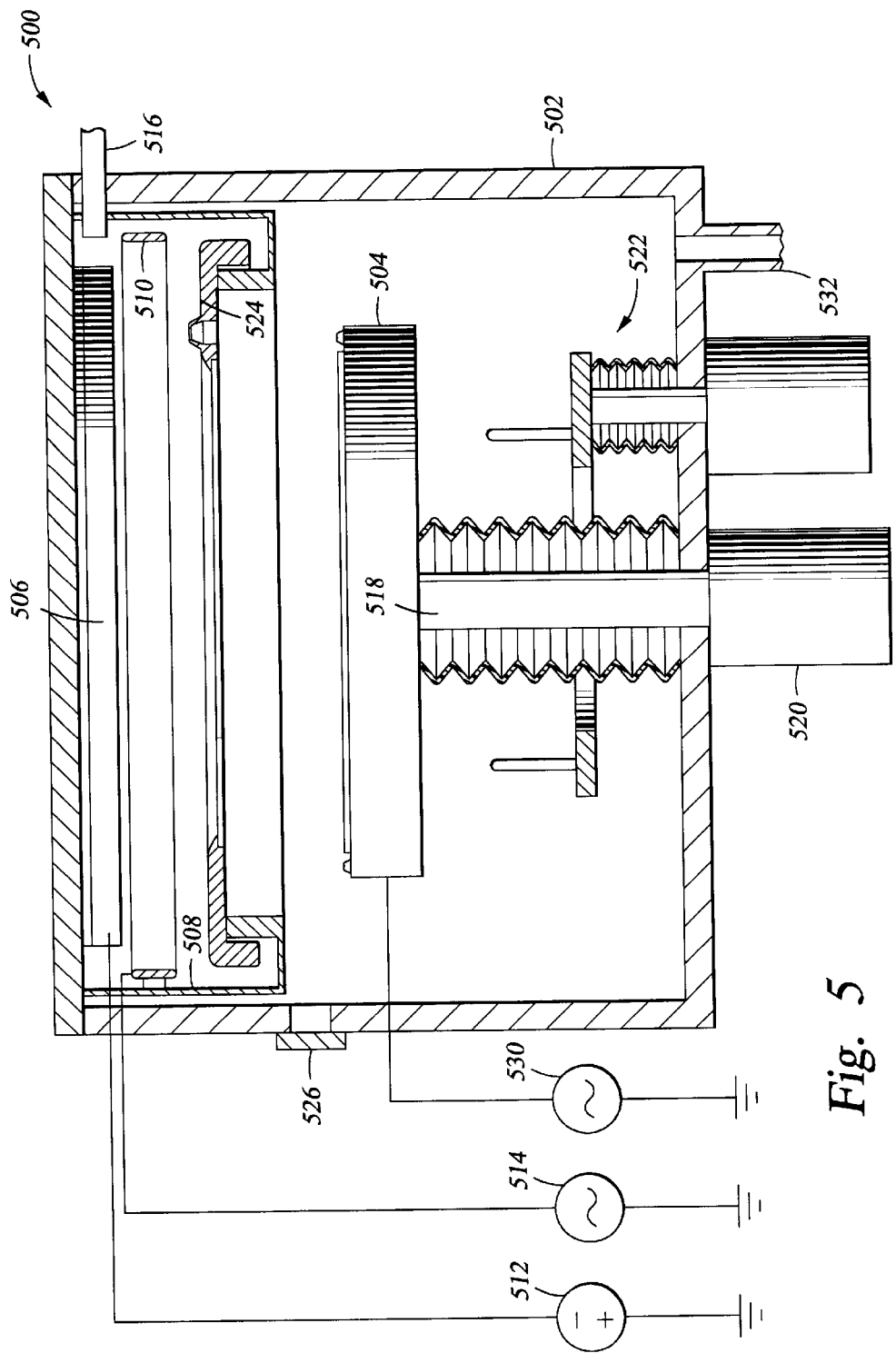
FIG. 5 is a cross sectional view of a PVD chamber useful for forming the barrier layers and seed layers according to the invention.

FIG. 5 is a cross sectional view of a PVD chamber useful for forming the barrier layers and seed layers according to the invention. An example of a PVD chamber is the Electra IMP™ chamber, available from Applied Materials, Inc., Santa Clara, Calif. Although the invention is described utilizing ionized metal plasma (IMP) chambers, the inventors contemplates utilizing other PVD chambers, including medium and high density plasma PVD chambers, to form the barrier layers and the seed layers according to the invention.

Referring to FIG. 5, the PVD chamber 500 generally includes a chamber enclosure 502, a substrate support member 504, a target 506, a shield 508 and a coil 510. The target 506 is disposed opposite of the substrate support member 504 and is electrically connected to a power supply 512. The shield 508 generally surrounds the region between the target 506 and the substrate support member 504 and is typically connected to a ground connection. The coil 510 is disposed interior of the shield 508 and is connected to an RF power supply 514. A gas inlet 516 disposed through the enclosure 502 introduces one or more processing gases into the chamber during processing. A chamber outlet 532 is disposed through a bottom portion of the enclosure 502 and attached to an exhaust system which maintains desired chamber pressure during processing.

The substrate support member 504 is attached to an actuator shaft 518 disposed through the bottom of the enclosure 502. The actuator shaft 518 is connected to an actuator 520 which facilitates movement of the substrate support member 504 to various positions in the chamber. A slit valve 526 disposed on a sidewall of the enclosure 502 facilitates transfer of substrates into and out of the chamber. A substrate lift assembly 522 disposed relative to the substrate support member 504 facilitates positioning of a substrate onto and off of the substrate support member 504. The substrate support member 504 may include temperature controls, such as cooling fluid channels, disposed adjacent the substrate support surface to maintain substrate temperature at a desired temperature during processing. The substrate support member 504 may be connected to a substrate support bias power supply 530. An example of a substrate support member useful for depositing seed layers according to one embodiment of the invention is the LT-BESC™ (Low Temperature Biasable Electrostatic Chuck) from Applied Materials, Inc., of Santa Clara, Calif. During processing, the substrate support member 504 positions a substrate disposed thereon to a position below a cover ring 524 disposed on a lower portion of the shield 508 to shield the perimeter edge of the substrate from deposition.

To achieve conformal coverage of surfaces within high aspect ratio features, the barrier layer according to one embodiment of the invention may be deposited using the following processing parameters in an ionized metal plasma physical vapor deposition chamber. The chamber pressure during the deposition process may be maintained at between about 5 mT to about 100 mT, preferably between about 10 mT and about 30 mT. The target may be DC-biased at between about 1 kW and about 3 kW with a bias voltage between about 100V and about 300V. The coil may be RF-biased at between about 1 kW and about 3 kW. The substrate support member may provide a substrate bias at between about 0 W and about 500 W with a bias voltage between about 50V and about 300V.

In one embodiment, a barrier layer comprising tantalum (Ta) is deposited utilizing the following chamber operating parameters. The target is DC-biased at about 1 kW DC power to a target. The coil is RF-biased at about 2 kW. The chamber pressure is maintained at about 20 mTorr. The substrate support is biased at about 350 W at about 13.56 MHz with an about 50% duty cycle. For a feature having less than about 0.35 $\mu$m opening width and >4:1 height to width aspect ratio, the barrier layer deposition process is carried out for about 18 seconds to deposit a barrier layer having about 150 Å film thickness on the surfaces of the interconnect feature.

A seed layer is deposited over the barrier to provide surfaces from which the electro-chemical deposition may occur. During the electro-deposition process, the seed layer is electrically connected to a power supply of the electroplating system. To achieve conformal coverage of surfaces within high aspect ratio features, the seed layer according to one embodiment of the invention may be deposited using the following processing parameters in an ionized metal plasma physical vapor deposition chamber. The chamber pressure during the deposition process may be maintained at between about 5 mT to about 100 mT, preferably between about 30 mT and about 50 mT. The target may be DC-biased at between about 1 kW and about 3 kW with a bias voltage between about 100V and about 300V. The coil may be RF-biased at between about 1 kW and about 5 kW. The substrate support member may provide a substrate bias at between about 0 W and about 500 W with a bias voltage between about 50V and about 300V.

In one embodiment of the invention, the step of depositing a seed layer comprises: providing about 1 kW DC power to a target; providing RF power to a coil at between about 2 kW and about 3 kW; maintaining chamber pressure at about 40 mTorr; and maintaining substrate support temperature at about 30° C. The substrate support is biased at about 350 W at about 13.56 MHz with an about 50% duty cycle. For a feature having less than about 0.35 $\mu$m opening width and >4:1 height:width aspect ratio, the seed layer deposition process is carried out for about 50 seconds to deposit a seed layer having about 2000 Å film thickness.

In another embodiment of the invention, the electroplating process may be enhanced by a two-step seed layer process. The above described seed layer deposition is performed by depositing 1000 Å of seed layer material, pausing for between about 30 seconds and about 120 seconds, and depositing another 1000 Å, utilizing similar processing parameters. Additionally, the gas input and chamber pressure of the PVD chamber may be stabilized for about 30–120 seconds before the deposition of the seed layer. After deposition of the seed layer on the substrate, the substrate may be transferred to an electrochemical deposition system to complete metallization of the interconnect features.

Figure 6:
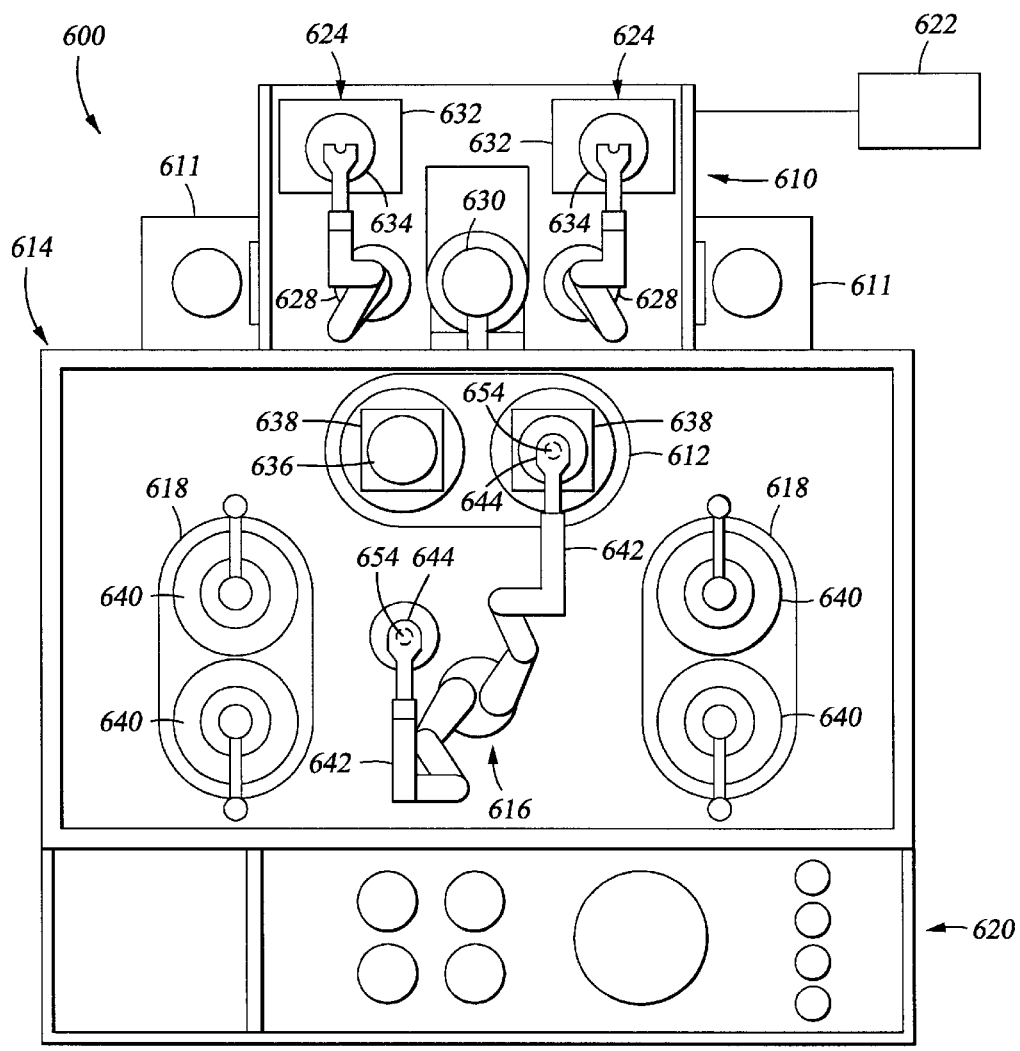
FIG. 6 is a schematic view of an electrochemical deposition system or electroplating system 600.

FIG. 6 is a schematic view of an electrochemical deposition system or electroplating system 600. The electroplating system 600 generally comprises a loading station 610, a mainframe 614, and an electrolyte replenishing system 620. The electroplating system platform 600 may be enclosed in a clean environment using panels such as plexiglass panels. Additionally, the mainframe 614 may be separated from the loading station 610 by plexiglass panels to separate the wet processing regions on the mainframe and the dry regions on the loading station. Slit valves or other door mechanisms disposed on the plexiglass panels may be utilized to facilitate substrate transfers on the system. The mainframe 614 generally comprises a centrally located mainframe transfer robot 616, a spin-rinse-dry (SRD) station 612, and a plurality of processing stations 618. Each processing station 618 may include one or more processing cells 640. An electrolyte replenishing system 620 is positioned adjacent the mainframe 614 and connected to the process cells 640 individually to circulate electrolyte used for the electroplating process. The electroplating system 600 also includes a control system 622, typically comprising a programmable microprocessor, which controls operation of all components of the electroplating system.

The loading station 610 may include one or more wafer cassette receiving areas 624, one or more loading station transfer robots 628 and at least one wafer orientor 630. The number of wafer cassette receiving areas, loading station transfer robots and wafer orientor disposed in the loading station 610 may be configured according to the desired throughput of the system. As shown for the embodiment, the loading station 610 includes two wafer cassette receiving areas 624, two loading station transfer robots 628 and one wafer orientor 630. A wafer cassette 632 containing wafers or substrates 634 is loaded onto the wafer cassette receiving area 624 to introduce wafers 634 into the electroplating system. The loading station transfer robot 628 transfers wafers 634 between the wafer cassette 632 and the wafer orientor 630. The loading station transfer robot 628 comprises a typical transfer robot commonly known in the art. The wafer orientor 630 positions each wafer 634 in a desired orientation to ensure that the wafer is properly processed. The loading station transfer robot 628 also transfers wafers 634 between the loading station 610 and the mainframe 614. In an alternative embodiment having one or more thermal anneal chambers 611 disposed adjacent the loading station, the loading station transfer robot 628 also transfers wafers 634 between the loading station 610 and the thermal anneal chambers. A detailed description of an electroplating system having an anneal chamber is provided in commonly assigned U.S. patent application Ser. No. 09/289,074, by Dordi et al., entitled ELECTRO-CHEMICAL DEPOSITION SYSTEM, filed on Apr. 8, 1999, now U.S. Pat. No. 6,258,220, which is hereby incorporated by reference in its entirety.

In the embodiment shown in FIG. 6, the SRD station 612 is disposed on the mainframe 614 at a position adjacent the loading station 610. One or more pass-through cassettes 638 may be disposed above the SRD station 612 to facilitate wafer transfers between the loading station 610 and the mainframe 614. Wafers may be placed on and removed from slots in the pass-through cassettes by the loading station transfer robot 628 and the mainframe transfer robot 616. In one embodiment, the mainframe transfer robot 616 comprises a plurality of individual robot arms 644 that provides independent access of wafers in the processing stations 618, the pass-through cassettes and the SRD station 612. One embodiment of an SRD chamber is described in commonly assigned U.S. patent application Ser. No. 09/201,566, by Lloyd et al., entitled SPIN-RINSE-DRYING PROCESS FOR ELECTROPLATED SEMICONDUCTOR WAFERS, filed on Nov. 30, 1998, pending, which is hereby incorporated by reference in its entirety.

The electroplating system 600 may include a plurality of processing stations to accomplish the desired throughput and efficiency requirements. As shown in FIG. 6, the electroplating system 600 includes two processing stations 618, and each processing station 618 includes two processing cells 640. The mainframe transfer robot 616 serves to transfer wafers between different stations disposed on the mainframe, including the processing stations 618, the pass-through cassettes, and the SRD stations 612. As shown in FIG. 6, the mainframe transfer robot 616 comprises two robot arms 642, corresponding to the number of processing cells 640 per processing station 618. Each robot arm 642 may be operable independently of the other arm to facilitate independent transfers of wafers in the system. Alternatively, the robot arms 642 operate in a linked fashion such that one robot extends as the other robot arm retracts. A flipper robot 644 is attached as an end effector for each of the robot arms 642. Flipper robots are generally known in the art and can be attached as end effectors for wafer handling robots. An example of a flipper robot is the model RR701, available from Rorze Automation, Inc., located in Milpitas, Calif. A vacuum gripper 654 may be disposed on the end effector to securely hold a wafer in a flipped position. The main transfer robot 616 which has a flipper robot as the end effector is capable of transferring substrates between different stations disposed on the mainframe as well as flipping the substrate being transferred to the desired surface orientation, i.e., substrate processing surface being face-down for the electroplating process. In one embodiment, the mainframe transfer robot 616 provides independent robot motion along the X-Y-Z axes by the robot arm 642 and independent substrate flipping rotation by the flipper robot end effector 644. By incorporating the flipper robot 644 as the end effector, the mainframe transfer robot 616 may transfer a wafer from a processing surface up position in the pass-through cassette to a process surface down position in the electroplating process cell.

Figure 7:
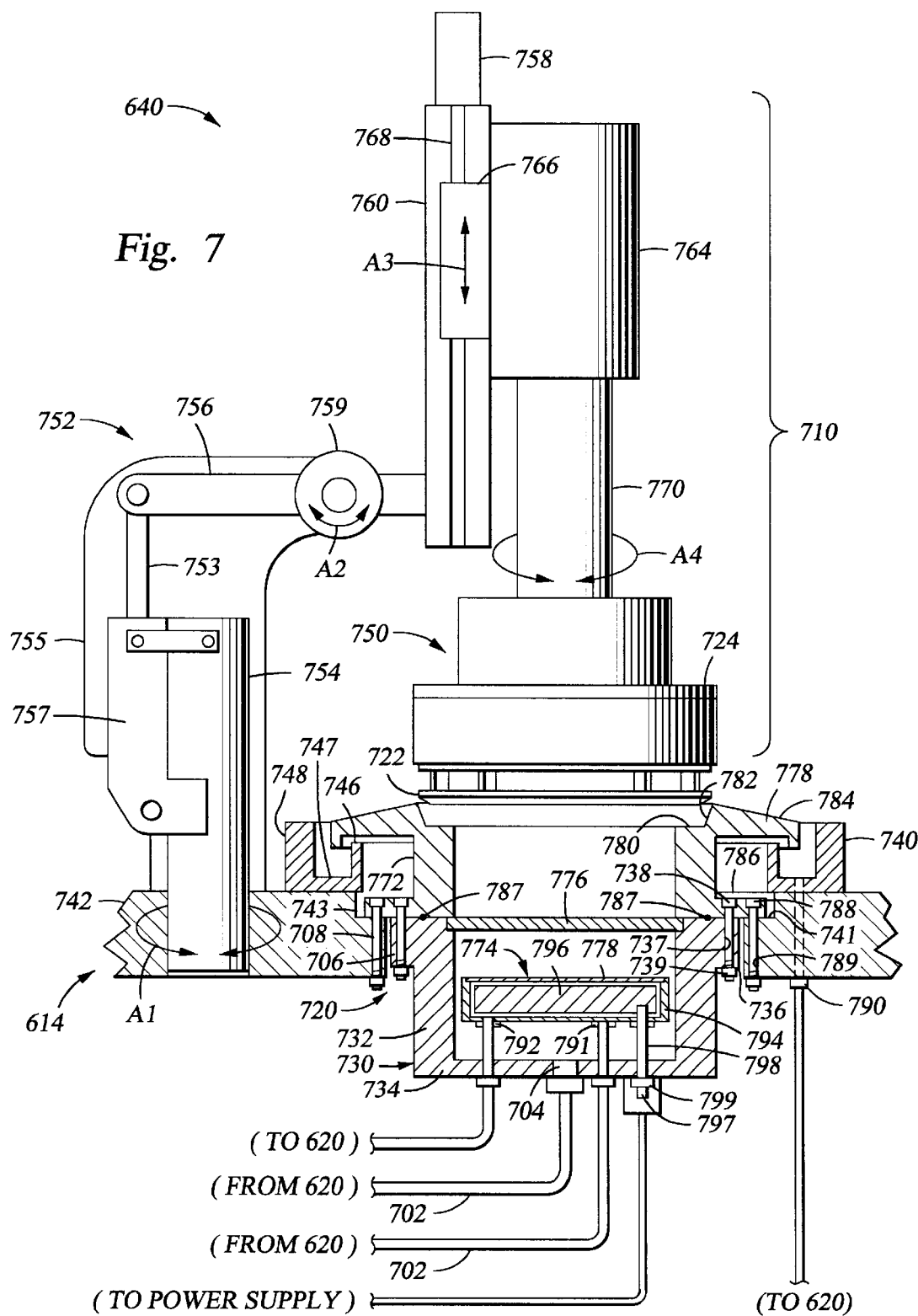
FIG. 7 is a cross sectional view of an electroplating process cell 640 useful for performing an electrochemical deposition of the invention.

FIG. 7 is a cross sectional view of an electroplating process cell 640 useful for performing an electrochemical deposition of the invention. The electroplating process cell 640 generally comprises a head assembly 710, a process kit 720 and an electrolyte collector 740. Preferably, the electrolyte collector 740 is secured onto the body 742 of the mainframe 614 over an opening 743 that defines the location for placement of the process kit 720. The electrolyte collector 740 includes an inner wall 746, an outer wall 748 and a bottom 747 connecting the walls. An electrolyte outlet 790 is disposed through the bottom 747 of the electrolyte collector 640 and connected to the electrolyte replenishing system 620 (shown in FIG. 6) through tubes, hoses, pipes or other fluid transfer connectors.

The head assembly 710 is mounted onto a head assembly frame 752. The head assembly frame 752 includes a mounting post 754, a post cover 755, and a cantilever arm 756. The mounting post 754 is mounted onto the body of the mainframe 614, and the post cover 755 covers a top portion of the mounting post 754. The process head assembly 710 may be a rotatable head assembly having a rotational actuator is disposed on the cantilevered arm and attached to the head assembly to rotate the head assembly during wafer processing. In one embodiment, the mounting post 754 provides rotational movement (as indicated by arrow A1) with respect to a vertical axis along the mounting post to allow rotation of the head assembly frame 752. The cantilever arm 756 extends laterally above the mounting post 754 and is pivotally connected to the post cover 755 at the pivot joint 759. The rotatable head assembly 710 is attached to a mounting slide 760 disposed at the distal end of the cantilever arm 756. The mounting slide 760 guides the vertical motion of the head assembly 710. A head lift actuator 758 is disposed on top of the mounting slide 760 to provide vertical displacement of the head assembly 710.

One end of the cantilever arm 756 is connected to the shaft 753 of a cantilever arm actuator 757, such as a pneumatic cylinder or a lead-screw actuator, mounted on the mounting post 754. The cantilever arm actuator 757 provides pivotal movement (as indicated by arrow A2) of the cantilever arm 756 with respect to the pivot joint 759 between the cantilever arm 756 and the post cover 755. When the cantilever arm actuator 757 is retracted, the cantilever arm 756 moves the head assembly 710 away from the process kit 720 to provide the spacing required to remove and/or replace the process kit 720 from the electroplating process cell 740. When the cantilever arm actuator 757 is extended, the cantilever arm 756 moves the head assembly 710 toward the process kit 720 to position the wafer in the head assembly 710 in a processing position. The cantilever arm actuator 757 may also be used to control the entry angle of a wafer as the wafer is lowered into contact with the electrolyte at the beginning of the electroplating process.

The head assembly 710 may include a rotating actuator 764 slideably connected to the mounting slide 760. The shaft 768 of the head lift actuator 758 is inserted through a lift guide 766 attached to the body of the rotating actuator 764. In one embodiment, the shaft 768 is a lead-screw type shaft that moves the lift guide 766 (as indicated by arrows A3) between various vertical position. The rotating actuator 764 is connected to the wafer holder assembly 750 through the shaft 770 and rotates the wafer holder assembly 750 (as indicated by arrows A4). The wafer holder assembly 750 includes a bladder assembly for holding a wafer and a cathode contact ring for providing electrical contact to a seed layer on a wafer.

The rotation of the wafer during the electroplating process may enhance the deposition results. However, rotation of the head assembly may not be necessary to achieve uniform electroplating deposition, particularly where the uniformity of electroplating deposition is achieved by adjusting the processing parameters, such as the electrolyte chemistry, electrolyte flow and other parameters.

The head assembly may also be rotated as the head assembly is lowered to position the wafer in contact with the electrolyte in the process cell as well as when the head assembly is raised to remove the wafer from the electrolyte in the process cell. The head assembly may be rotated at a high speed (i.e., >20 rpm) after the head assembly is lifted from the process cell to enhance removal of residual electrolyte on the head assembly.

The wafer holder assembly 750 generally comprises a wafer holder 724 and a cathode contact ring 722. In general, the contact ring 722 comprises an annular body having a plurality of conducting members disposed thereon. The annular body is constructed of an insulating material to electrically isolate the plurality of conducting members. Together the body and conducting members form a diametrically interior substrate seating surface which, during processing, supports a substrate and provides a current thereto.

Figure 8:
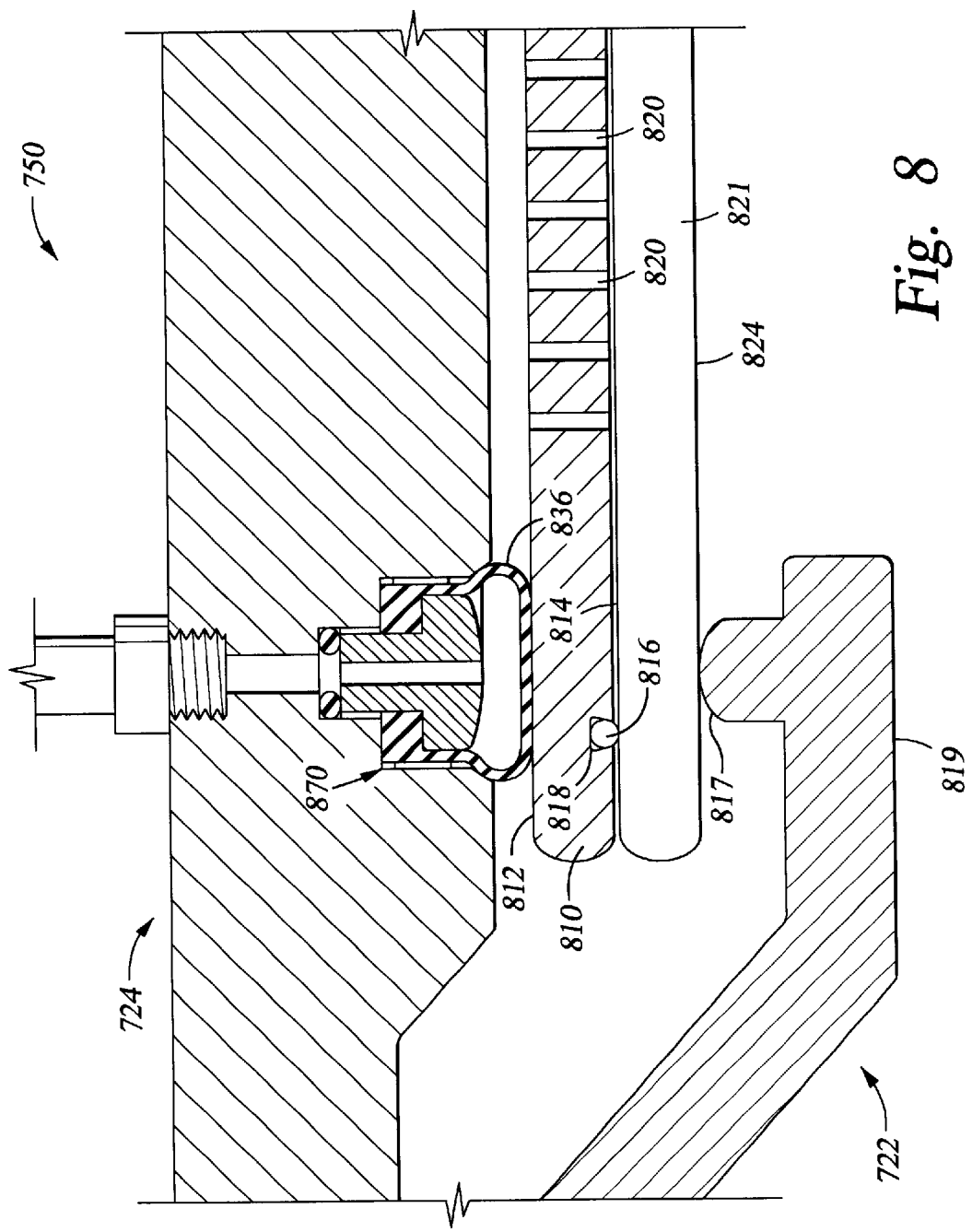
FIG. 8 is a partial cross sectional view of one embodiment of a wafer holder assembly.

FIG. 8 is a partial cross sectional view of one embodiment of a wafer holder assembly. The wafer holder assembly 750 includes a wafer holder 724 which secures a substrate in contact with the contact ring 722. The contact ring 722 includes an annular body portion 819 and a contact portion 817 extending from the body portion 819 to provide electrical contact with a seed layer on a substrate plating surface 824. The wafer holder 724 includes a bladder assembly 870 having an inflatable bladder 836 attached to a back surface of an intermediary wafer holder plate 810. In one embodiment, a portion of the inflatable bladder 836 is sealingly attached to the back surface 812 of the intermediary wafer holder plate 810 using an adhesive or other bonding material. The front surface 814 of the intermediary wafer holder plate 810 is adapted to receive a wafer or substrate 821 to be processed, and an elastomeric o-ring 816 is disposed in an annular groove 818 on the front surface 814 of the intermediary wafer holder plate 810 to contact a peripheral portion of the wafer back surface. The elastomeric o-ring 816 provides a seal between the wafer back surface and the front surface of the intermediary wafer holder plate 810. The intermediary wafer holder plate 810 may include a plurality of bores or holes 820 extending through the plate that are in fluid communication with a vacuum port to facilitate securing the wafer on the wafer holder using a vacuum force applied to the backside of the wafer. The inflatable bladder does not directly contact a wafer being processed, and thus the risk of cutting or damaging the inflatable bladder during wafer transfers is significantly reduced. The elastomeric O-ring 816 is preferably coated or treated to provide a hydrophilic surface (as discussed above for the surfaces of the cathode contact ring) for contacting the wafer, and the elastomeric O-ring 816 is replaced as needed to ensure proper contact and seal to the wafer.

Referring back to FIG. 7, the process kit 720 is positioned below the wafer holder assembly 750. The process kit 720 generally comprises a bowl 730, a container body 772, an anode assembly 774 and a filter 776. The anode assembly 774 may be disposed below the container body 772 and attached to a lower portion of the bowl 730, and the filter 776 is disposed between the anode assembly 774 and the container body 772. The container body 772 may be a cylindrical body comprised of an electrically insulative material, such as ceramics, plastics, plexiglass (acrylic), lexane, PVC, CPVC, and PVDF. Alternatively, the container body 772 can be made from a metal, such as stainless steel, nickel and titanium, which is coated with an insulating layer, such as Teflon™, PVDF, plastic, rubber and other combinations of materials that do not dissolve in the electrolyte and can be electrically insulated from the electrodes (i.e., the anode and cathode of the electroplating system). The container body 772 is sized and adapted to conform to the wafer plating surface and the shape of a wafer being processed through the system, typically circular or rectangular in shape. One embodiment of the container body 772 comprises a cylindrical ceramic tube having an inner diameter that has about the same dimension as or slightly larger than the wafer diameter.

An upper portion of the container body 772 extends radially outwardly to form an annular weir 778. The weir 778 extends over the inner wall 746 of the electrolyte collector 740 and allows the electrolyte to flow into the electrolyte collector 740. The upper surface of the weir 778 may be disposed at the same level or higher than the contact surface of the cathode contact ring 722 during processing to ensure electrolyte contact to the wafer plating surface. In one embodiment, the upper surface of the weir 778 includes an inner annular flat portion 780, a middle inclined portion 782 and an outer declined portion 784. When a wafer is positioned in the processing position, the wafer plating surface is positioned in the cylindrical opening of the container body 772, and a gap for electrolyte flow is formed between the lower surface of the cathode contact ring 722 and the upper surface of the weir 778. The lower surface of the cathode contact ring 722 may be disposed above the inner flat portion 780 and the middle inclined portion of the weir 778. The outer declined portion 784 is sloped downwardly to facilitate flow of the electrolyte into the electrolyte collector 740.

A lower portion of the container body 772 extends radially outwardly to form a lower annular flange 786 for securing the container body 772 to a flange 741 on the body 742 of the mainframe 614. The outer dimension (i.e., circumference) of the annular flange 786 is smaller than the dimensions of the opening 743 on the body 742 of the mainframe 614 and the inner circumference of the electrolyte collector 740 to allow removal and replacement of the process kit 720 from the electroplating process cell 640. In one embodiment, a plurality of bolts 788 are fixedly disposed on the annular flange 786 and extend downwardly through matching bolt holes 789 on the body 742 of the mainframe 614, and a plurality of removable fastener nuts 790 secure the process kit 720 onto the body 742 of the mainframe 614. The nuts/bolts combination facilitates fast and easy removal and replacement of the components of the process kit 720 during maintenance.

The bowl 730 is secured onto the annular flange 786 of the container body 772 radially inwardly of the flange 741 of the body 742 of the mainframe 614. The bowl 730 generally comprises a cylindrical portion 732 and a bottom portion 734. An upper annular flange 736 extends radially outwardly from the top of the cylindrical portion 732. The upper annular flange 736 includes a plurality of holes 737 that matches the number of bolts 738 extending from the lower annular flange 786 of the container body 772. To secure the upper annular flange 736 of the bowl 730 and the lower annular flange 786 of the container body 772, the bolts 738 are inserted through the holes 737, and fastener nuts 739 are fastened onto the bolts 738. A seal 787, such as an elastomer O-ring, is disposed between container body 772 and the bowl 730 radially inwardly from the bolts 788 to prevent leaks from the process kit 720. The outer dimension (i.e., circumference) of the upper annular flange 736 is smaller than the inner dimensions of the flange 741 of the body 742 on the main frame 614 to facilitate installation or removal of the bowl 730 from the container body 772.

The filter 776 may be attached to and completely covers the lower opening of the container body 772 (or the upper opening of the bowl 730). The filter 776 may keep contaminate particles from reaching the substrate plating surface. The filter 776 may also be utilized to provide a desired electrolyte flow pattern to the substrate plating surface to enhance plating results.

An anode assembly 774 is disposed below the filter 776 in the bowl 730 and may be removably secured to the bowl 730. The anode assembly 774 comprises a consumable anode that serves as a metal source in the electrolyte. Alternatively, the anode assembly 774 comprises a non-consumable anode, and the metal to be electroplated is supplied within the electrolyte from the electrolyte replenishing system 620. As shown in FIG. 7, the anode assembly 774 includes a metal source 796, an anode enclosure 794, and a filter membrane 778. The filter membrane 778 may comprise a hydrophilic membrane which filters byproducts (e.g., anode sludge) from the dissolution of the metal source 796 and other undesired particles. The metal source 796 may comprise a soluble metal plate, such as high purity copper plate for electrochemical deposition of copper. Alternatively, the metal source 776 may comprise metal particles enclosed in a porous anode enclosure or a perforated metal sheet.

One or more anode electrode contacts 798 are inserted through the anode enclosure 794 to provide electrical connection to the metal source 796 from a power supply. The anode electrode contact 798 may be made from a conductive material that is insoluble in the electrolyte, such as titanium, platinum and platinum-coated stainless steel. The anode electrode contact 798 extends through the bowl 730 and is connected to an electrical power supply. In one embodiment, the anode electrical contact 798 includes a threaded portion 797 for a fastener nut 799 to secure the anode electrical contact 798 to the bowl 730, and a seal, such as an elastomer washer, may be disposed between the fastener nut 799 and the bowl 730 to prevent leaks from the process kit 720.

The anode enclosure 794 includes an electrolyte inlet 791 which is connected to an electrolyte supply line 702 through the bottom portion 734 of the bowl 730. The anode enclosure 794 also includes an electrolyte outlet 792 which is connected to the electrolyte replenishing system 620. The electrolyte inlet/outlet of the anode assembly facilitates metal dissolution from the soluble metal of the metal source 796.

The process bowl 730 includes an electrolyte inlet 704 which may be releasably connected to an electrolyte supply line 702. The electrolyte supply line 702 provides the main electrolyte flow into the electroplating cell for facilitating the electrochemical deposition. The electrolyte inlet 704 and the electrolyte supply line 702 may be connected by a releasable connector that facilitates easy removal and replacement of the process kit 720. When the process kit 720 needs maintenance, the electrolyte is drained from the process kit 720, and the electrolyte flow in the electrolyte supply line is discontinued and drained. The connector for the electrolyte supply line is released from the electrolyte inlet 704, and the electrical connection to the anode assembly 774 is also disconnected. The head assembly 710 is raised or rotated to provide clearance for removal of the process kit 720. The process kit 720 is then removed from the mainframe 614, and a new or reconditioned process kit is replaced into the mainframe 614.

Alternatively, the bowl 730 along with the anode and the filter may be removed from the container body 772 for maintenance. In this case, the nuts securing the bowl 730 and the container body 772 and the nuts securing the anode assembly 774 to the bowl 730 are removed to facilitate removal of the bowl 730 and the anode assembly 774. New or reconditioned anode assembly may be placed and secured to the bowl 730, and the bowl 730 may be re-secured onto the container body 772.

Figure 9:
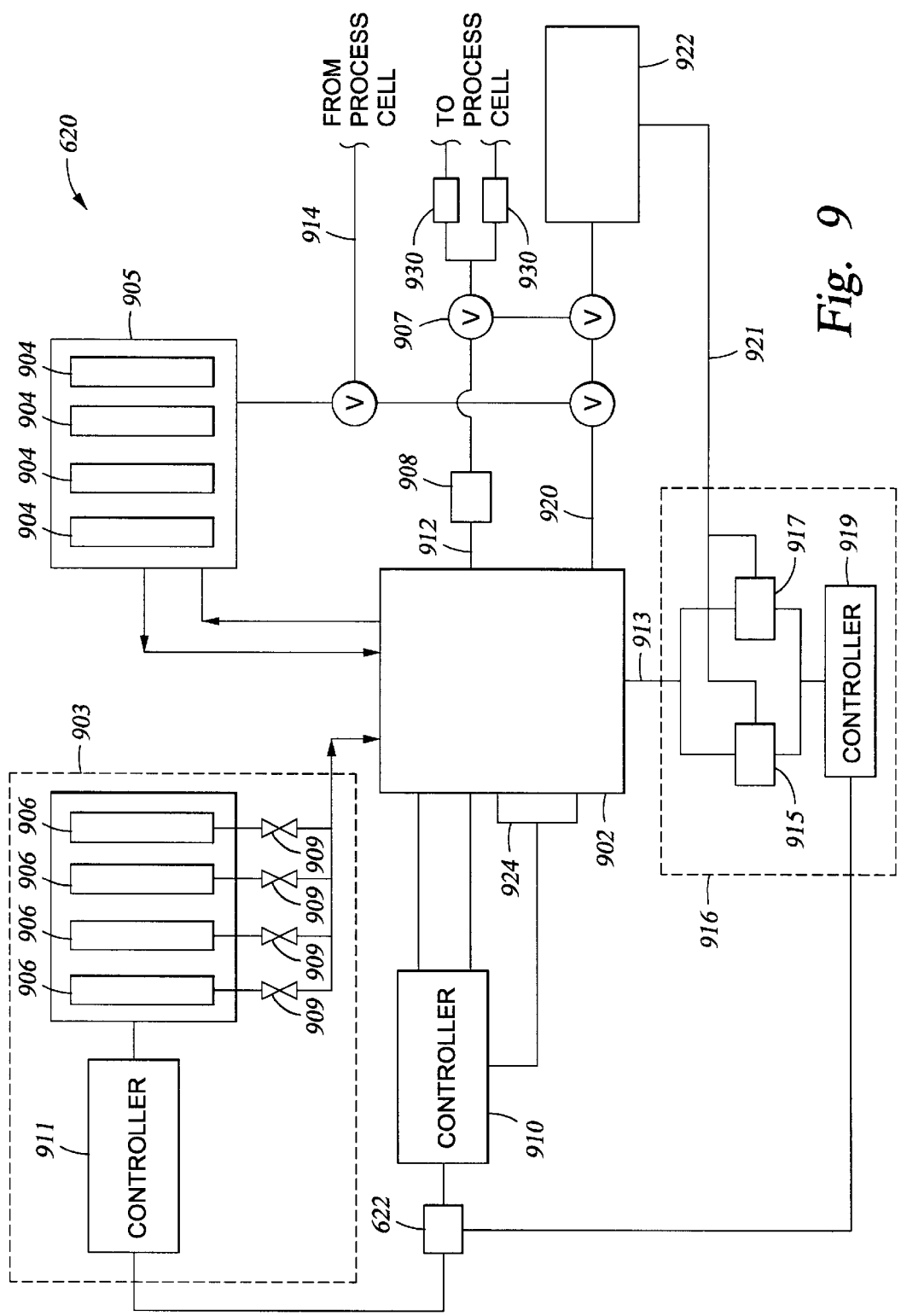
FIG. 9 is a schematic diagram of an electrolyte replenishing system 620.

FIG. 9 is a schematic diagram of an electrolyte replenishing system 620. The electrolyte replenishing system 620 provides the electrolyte to the electroplating process cells for the electroplating process. The electrolyte replenishing system 620 generally comprises a main electrolyte tank 902, a dosing module 903, a filtration module 905, a chemical analyzer module 916, and an electrolyte waste disposal system 922 connected to the analyzing module 916 by an electrolyte waste drain 920. One or more controllers control the composition of the electrolyte in the main tank 902 and the operation of the electrolyte replenishing system 620. The controllers are independently operable but integrated with the control system 622 of the electroplating system platform 600.

The main electrolyte tank 902 provides a reservoir for electrolyte and includes an electrolyte supply line 912 that is connected to each of the electroplating process cells through one or more fluid pumps 908 and valves 907. A heat exchanger 924 or a heater/chiller disposed in thermal connection with the main tank 902 controls the temperature of the electrolyte stored in the main tank 902. The heat exchanger 924 is connected to and operated by the controller 910.

The dosing module 903 is connected to the main tank 902 by a supply line and includes a plurality of source tanks 906, or feed bottles, a plurality of valves 909, and a controller 911. The source tanks 906 contain the chemicals needed for composing the electrolyte and typically include a deionized water source tank and copper sulfate ($CuSO_4$) source tank for composing the electrolyte. Other source tanks 906 may contain hydrogen sulfate ($H_2SO_4$), hydrogen chloride (HCl) and various additives such as glycol. Each source tank is preferably color coded and fitted with a unique mating outlet connector adapted to connect to a matching inlet connector in the dosing module. By color coding the source tanks and fitting the source tanks with unique connectors, errors caused by human operators when exchanging or replacing the source tanks are significantly reduced.

The deionized water source tank preferably also provides deionized water to the system for cleaning the system during maintenance. The valves 909 associated with each source tank 906 regulate the flow of chemicals to the main tank 902 and may be any of numerous commercially available valves such as butterfly valves, throttle valves and the like. Activation of the valves 909 is accomplished by the controller 911 which is preferably connected to the system control 622 to receive signals therefrom.

The electrolyte filtration module 905 includes a plurality of filter tanks 904. An electrolyte return line 914 is connected between each of the process cells and one or more filter tanks 904. The filter tanks 904 remove the undesired contents in the used electrolyte before returning the electrolyte to the main tank 902 for re-use. The main tank 902 is also connected to the filter tanks 904 to facilitate re-circulation and filtration of the electrolyte in the main tank 902. By re-circulating the electrolyte from the main tank 902 through the filter tanks 904, the undesired contents in the electrolyte are continuously removed by the filter tanks 904 to maintain a consistent level of purity. Additionally, re-circulating the electrolyte between the main tank 902 and the filtration module 905 allows the various chemicals in the electrolyte to be thoroughly mixed.

The electrolyte replenishing system 620 also includes a chemical analyzer module 916 that provides real-time chemical analysis of the chemical composition of the electrolyte. The analyzer module 916 is fluidly coupled to the main tank 902 by a sample line 913 and to the waste disposal system 922 by an outlet line 921. The analyzer module 916 generally comprises at least one analyzer and a controller to operate the analyzer. The number of analyzers required for a particular processing tool depends on the composition of the electrolyte. For example, while a first analyzer may be used to monitor the concentrations of organic substances, a second analyzer is needed for inorganic chemicals. In the specific embodiment shown in FIG. 9, the chemical analyzer module 916 comprises an auto titration analyzer 915 and a cyclic voltametric stripper (CVS) 917. Both analyzers are commercially available from various suppliers. An auto titration analyzer which may be used to advantage is available from Parker Systems and a cyclic voltametric stripper is available from ECI. The auto titration analyzer 915 determines the concentrations of inorganic substances such as copper chloride and acid. The CVS 917 determines the concentrations of organic substances such as the various additives which may be used in the electrolyte and by-products resulting from the processing which are returned to the main tank 902 from the process cells.

The analyzer module shown FIG. 9 is merely illustrative. In another embodiment, each analyzer may be coupled to the main electrolyte tank by a separate supply line and be operated by separate controllers. Persons skilled in the art will recognize other embodiments.

In operation, a sample of electrolyte is flowed to the analyzer module 916 via the sample line 913. Although the sample may be taken periodically, preferably a continuous flow of electrolyte is maintained to the analyzer module 916. A portion of the sample is delivered to the auto titration analyzer 915 and a portion is delivered to the CVS 917 for the appropriate analysis. The controller 919 initiates command signals to operate the analyzers 915, 917 in order to generate data. The information from the chemical analyzers 915, 917 is then communicated to the control system 622. The control system 622 processes the information and transmits signals which include user-defined chemical dosage parameters to the dosing controller 911. The received information is used to provide real-time adjustments to the source chemical replenishment rates by operating one or more of the valves 909 thereby maintaining a desired, and preferably constant, chemical composition of the electrolyte throughout the electroplating process. The waste electrolyte from the analyzer module is then flowed to the waste disposal system 922 via the outlet line 921.

Although a preferred embodiment utilizes real-time monitoring and adjustments of the electrolyte, various alternatives may be employed according to the present invention. For example, the dosing module 903 may be controlled manually by an operator observing the output values provided by the chemical analyzer module 916. The system software may allow for both an automatic real-time adjustment mode as well as an operator (manual) mode. Further, although multiple controllers are shown in FIG. 9, a single controller may be used to operate various components of the system such as the chemical analyzer module 916, the dosing module 903, and the heat exchanger 924. Other embodiments will be apparent to those skilled in the art.

The electrolyte replenishing system 620 also includes an electrolyte waste drain 920 connected to an electrolyte waste disposal system 922 for safe disposal of used electrolytes, chemicals and other fluids used in the electroplating system. The electroplating cells may include a direct line connection to the electrolyte waste drain 920 or the electrolyte waste disposal system 922 to drain the electroplating cells without returning the electrolyte through the electrolyte replenishing system 620. The electrolyte replenishing system 620 may also includes a bleed off connection to bleed off excess electrolyte to the electrolyte waste drain 920.

The electrolyte replenishing system 220 may also include one or more degasser modules 930 adapted to remove undesirable gases from the electrolyte. The degasser module generally comprises a membrane that separates gases from the fluid passing through the degasser module and a vacuum system for removing the released gases. The degasser modules 930 may be placed in line on the electrolyte supply line 912 adjacent to the process cells 640. The degasser modules 930 may be positioned as close as possible to the process cells 640 so that most of the gases from the electrolyte replenishing system are removed by the degasser modules before the electrolyte enters the process cells. In one embodiment, each degasser module 930 includes two outlets to supply degassed electrolyte to the two process cells 640 of each processing station 618. Alternatively, a degasser module 930 is provided for each process cell. The degasser modules can be placed at many other alternative positions. For example, the degasser module can be placed at other positions in the electrolyte replenishing system, such as along with the filter section or in a closed-loop system with the main tank or with the processing cell. As another example, one degasser module is placed in line with the electrolyte supply line 912 to provide degassed electrolyte to all of the process cells 640 of the electrochemical deposition system. Additionally, a separate degasser module is positioned in-line or in a closed-loop with the deionized water supply line and is dedicated for removing oxygen from the deionized water source. Because deionized water is used to rinse the processed substrates, free oxygen gases are preferably removed from the deionized water before reaching the SRD modules so that the electroplated copper is less likely to become oxidized by the rinsing process. Degasser modules are well known in the art and commercial embodiments are generally available and adaptable for use in a variety of applications. Commercially available degasser modules are available from Millipore Corporation, located in Bedford, Mass.

Although not shown in FIG. 9, the electrolyte replenishing system 620 may include a number of other components. For example, the electrolyte replenishing system 620 preferably also includes one or more additional tanks for storage of chemicals for a wafer cleaning system, such as the SRD station. Double-contained piping for hazardous material connections may also be employed to provide safe transport of the chemicals throughout the system. Optionally, the electrolyte replenishing system 620 includes connections to additional or external electrolyte processing system to provide additional electrolyte supplies to the electroplating system.

Referring back to FIG. 6, the electroplating system platform 600 includes a control system 622 that controls the functions of each component of the platform. The control system 622 may be mounted above the mainframe 614 and comprises a programmable microprocessor. The programmable microprocessor is typically programmed using a software designed specifically for controlling all components of the electroplating system platform 600. The control system 622 also provides electrical power to the components of the system and includes a control panel that allows an operator to monitor and operate the electroplating system platform 600. The control panel may be a stand-alone module that is connected to the control system 622 through a cable and provides easy access to an operator. Generally, the control system 622 coordinates the operations of the loading station 610, the SRD station 612, the mainframe 614 and the processing stations 618. Additionally, the control system 622 coordinates with the controller of the electrolyte replenishing system 620 to provide the electrolyte for the electroplating process.

The following is a description of a typical wafer electroplating process sequence through the electroplating system platform 600 as shown in FIG. 6. A wafer cassette containing a plurality of wafers is loaded into the wafer cassette receiving areas 624 in the loading station 610 of the electroplating system platform 600. A loading station transfer robot 628 picks up a wafer from a wafer slot in the wafer cassette and places the wafer in the wafer orientor 630. The wafer orientor 630 determines and orients the wafer to a desired orientation for processing through the system. The loading station transfer robot 628 then transfers the oriented wafer from the wafer orientor 630 and positions the wafer in one of the wafer slots in the wafer pass-through cassette 638 in the SRD station 612. The mainframe transfer robot 616 picks up the wafer from the wafer pass-through cassette 638 and positions the wafer for transfer by the flipper robot 644. The flipper robot 644 rotates its robot blade below the wafer and picks up wafer from mainframe transfer robot blade. The vacuum suction gripper on the flipper robot blade secures the wafer on the flipper robot blade, and the flipper robot flips the wafer from a face up position to a face down position. The flipper robot 644 rotates and positions the wafer face down in the wafer holder assembly 750. The wafer is positioned below the wafer holder 724 but above the cathode contact ring 722. The flipper robot 644 then releases the wafer to position the wafer into the cathode contact ring 722. The wafer holder 724 moves toward the wafer and the vacuum chuck secures the wafer on the wafer holder 724. The bladder assembly 870 on the wafer holder assembly 750 exerts pressure against the wafer backside to ensure electrical contact between the wafer plating surface and the cathode contact ring 722.

The head assembly 710 is lowered to a processing position above the process kit 720. At this position the wafer is below the upper plane of the weir 778 and contacts the electrolyte contained in the process kit 720. The power supply is activated to supply electrical power (i.e., voltage and current) to the cathode and the anode to enable the electroplating process. The electrolyte is typically continually pumped into the process kit during the electroplating process. The electrical power supplied to the cathode and the anode and the flow of the electrolyte are controlled by the control system 622 to achieve the desired electroplating results. The head assembly may be rotated as the head assembly is lowered into contact with the electrolyte.

In one embodiment of the invention, the electroplating process may be performed utilizing an electroplating cell containing a highly resistive electrolyte. For copper metallization, the electrolyte may comprise $CuSO_4$ having a molar concentration between about 0.5M and about 1.1M, HCl at a concentration between about 10 ppm and about 1000 ppm, a carrier additive at a concentration between about 5 mill and about 40 ml/l, $H_2SO_4$ having a concentration less than about 0.4 percent. The metallization or filling of the feature is accomplished by applying a first current density to the plating surface (i.e., seed layer) at about 1 $mA/cm^2$ to 10 $mA/cm^2$ for about 10 seconds to about 30 seconds followed by a second current density at about 10 $mA/cm^2$ to about 80 $mA/cm^2$ for about 60 seconds to about 120 seconds. The electrolyte is flowed at between 2 gpm and about 4.5 gpm during the electroplating process. No substrate rotation is required to achieve uniform deposition results.

After the electroplating process is completed, the head assembly 710 raises the wafer holder assembly and removes the wafer from the electrolyte. The head assembly may be rotated for a period of time to enhance removal of residual electrolyte from the wafer holder assembly. The vacuum chuck and the bladder assembly of the wafer holder then release the wafer from the wafer holder, and the wafer holder is raised to allow the flipper robot blade to pick up the processed wafer from the cathode contact ring. The flipper robot rotates the flipper robot blade above the backside of the processed wafer in the cathode contact ring and picks up the wafer using the vacuum suction gripper on the flipper robot blade. The flipper robot rotates the flipper robot blade with the wafer out of the wafer holder assembly, flips the wafer from a face-down position to a face-up position, and positions the wafer on the mainframe transfer robot blade. The mainframe transfer robot then transfers and positions the processed wafer above the SRD module 636. The SRD wafer support lifts the wafer, and the mainframe transfer robot blade retracts away from the SRD module 636. The wafer is cleaned in the SRD module using deionized water or a combination of deionized water and a cleaning fluid as described in detail above. The wafer is then positioned for transfer out of the SRD module. The loading station transfer robot 628 picks up the wafer from the SRD module 636 and transfers the processed wafer into the wafer cassette. Alternatively, the processed wafer may be transferred into the RTA chamber 611 for an anneal treatment process to enhance the properties of the deposited materials. The annealed wafer is then transferred out of the RTA chamber 611 by the loading station robot 628 and placed back into the wafer cassette for removal from the electroplating system. The above-described sequence can be carried out for a plurality of wafers substantially simultaneously in the electroplating system platform 600 of the present invention.

EXAMPLE

The present invention provides a method for filling sub-micron features on a substrate comprising reactive precleaning the substrate; depositing a barrier layer on the substrate using high density plasma physical vapor deposition; depositing a seed layer over the barrier layer using high density plasma physical vapor deposition; and electrochemically depositing a metal using a highly resistive electrolyte and applying a first current density during a first deposition period followed by a second current density during a second period. The steps of depositing the barrier layer and depositing the seed layer are performed in a high density plasma chamber, and the electroplating process is performed in an electroplating cell.

To begin the pre-clean process, a substrate having sub-micron, high aspect ratio interconnect features is transferred into a pre-clean chamber. A pre-clean gas mixture comprising about 5% hydrogen and about 95% helium is introduced into the chamber, and the chamber pressure is maintained at about 80 mTorr. The RF power provided to the coil is at about 450 W at 2.0 MHz, and the substrate support is biased at about 40 W. The reactive pre-clean process is carried out for about 60 seconds.

The substrate is transferred into an HDP-PVD chamber configured to deposit a barrier layer, such as a tantalum barrier layer. A process gas for the plasma sputtering process, such as argon, is flowed into the chamber, and the chamber pressure is maintained at about 20 mTorr. The target is biased at about 1 kW DC, and the coil of the HDP-PVD chamber is biased with an RF power at about 2 kW. The substrate support is biased at about 350 W at 13.56 MHz with about a 50% duty cycle. For a feature having less than about 0.35 μm opening width and >4:1 height:width aspect ratio, the barrier layer deposition process is carried out for about 18 seconds to deposit a barrier layer having about 150 Å film thickness on the surfaces of the interconnect feature.

The substrate is then transferred into another HDP-PVD chamber configured to deposit a seed layer, such as a copper seed layer. A process gas for the plasma sputtering process, such as argon, is flowed into the chamber, and the chamber pressure is maintained at about 40 mTorr. The chamber conditions are stabilized for about 60 seconds. To begin deposition, the target is biased at about 1 kW DC, and the coil of the HDP-PVD chamber is biased with an RF power at about 3 kW. The substrate support is biased at about 350 W at 13.56 MHz with about a 50% duty cycle. The temperature of the substrate support is maintained at about 30° C. For a feature having less than about 0.35 μm opening width and >4:1 height:width aspect ratio, the seed layer deposition process is carried out for about 25 seconds to deposit a seed layer having about 1000 Å film thickness on the surfaces of the interconnect feature over the barrier layer. The deposition is paused for about 60 seconds with the bias power temporarily discontinued to the target and the coil. Deposition is resumed after the 60 seconds cooldown period. The seed layer deposition process is continued for about 25 additional seconds to deposit another layer of seed layer having about 1000 Å film thickness.

The substrate is then transferred to an electrochemical deposition system, and the interconnect features on the substrate are filled using an electrochemical deposition or electroplating cell containing a highly resistive electrolyte. For copper metallization, the electrolyte comprises $CuSO_4$ having a molar concentration between about 0.5M and about 1.1M, HCl at a concentration between about 50 ppm and about 100 ppm, a carrier additive at a concentration between about 12.5 ml/l and about 20 ml/l, $H_2SO_4$ having a concentration less than about 0.2 percent. The metallization or filling of the feature is accomplished by applying a first current density to the plating surface (i.e., seed layer) at about 2 $mA/cm^2$ for about 18 seconds followed by a second current density at about 40 $mA/cm^2$ for about 90 seconds. The electrolyte is flowed at between 2 gpm and about 4.5 gpm during the electroplating process. No substrate rotation is required to achieve uniform deposition results.

While the foregoing is directed to the preferred embodiment of the present invention, other and further embodiments of the invention may be devised without departing from the basic scope thereof, and the scope thereof is determined by the claims that follow.

What is claimed is:

1. A method for filling sub-micron features on a substrate, comprising:
   a) reactive precleaning the substrate;
   b) depositing a barrier layer on the substrate using high density plasma physical vapor deposition;
   c) depositing a seed layer over the barrier layer using high density plasma physical vapor deposition; and
   d) electro-chemically depositing a metal using an electrolyte comprising $CuSO_4$ having a molar concentra-
   tion between about 0.5 M and about 1.1 M, HCl at a concentration between about 10 ppm and about 1000 ppm, a carrier additive at a concentration between about 5 ml/l and about 40 ml/l, and $H_2SO_4$ having a concentration less than about 0.4 percent, and applying a first current density during a first deposition period followed by a second current density of between about 10 and 80 $mA/cm^2$ during a second period.

2. The method of claim 1 wherein the electro-chemically deposited metal is copper.

3. The method of claim 1 wherein the step of reactive precleaning the substrate comprises:
   i) introducing a preclean gas mixture comprising 5% hydrogen and 95% helium into a chamber;
   ii) maintaining chamber pressure at about 80 mTorr;
   iii) providing RF power to a coil at about 450 W at 2.0 MHz; and
   iv) biasing a substrate support at about 40 W.

4. The method of claim 1 wherein the step of depositing a barrier layer comprises:
   i) providing about 1 kW DC power to a target;
   ii) providing RF power to a coil at about 2 kW;
   iii) maintaining chamber pressure at about 20 mTorr; and
   iv) biasing a substrate support at about 350 W at 13.56 MHz with about a 50% duty cycle.

5. The method of claim 1 wherein the step of depositing a seed layer comprises:
   i) providing about 1 kW DC power to a target;
   ii) providing RF power to a coil at between about 2 kW and about 3 kW;
   iii) maintaining chamber pressure at about 40 mTorr; and
   iv) maintaining temperature at about 30° C.

6. The method of claim 1 wherein the metal is electro-chemically deposited using an electrolyte comprising $CuSO_4$ having a molar concentration between about 0.5M and about 1.1M.

7. The method of claim 1 wherein the metal is electro-chemically deposited using an electrolyte comprising HCl at a concentration between about 50 ppm and about 100 ppm.

8. The method of claim 1 wherein the metal is electro-chemically deposited using an electrolyte comprising a carrier additive at a concentration between about 12.5 ml/l and about 20 ml/l.

9. The method of claim 1 wherein the metal is electro-chemically deposited using an electrolyte comprising $H_2SO_4$ having a concentration between about 0 and 0.2 percent.

10. The method of claim 1 wherein the first current density is at about 2 $mA/cm^2$ and the first period is about 18 seconds.

11. The method of claim 1 wherein the second current density is at about 40 $mA/cm^2$ and the second period is about 90 seconds.

12. The method of claim 1 wherein the metal is electro-chemically deposited by flowing the electrolyte at between 2 gpm and about 4.5 gpm.

13. The method of claim 1 wherein the step of depositing the seed layer comprises:
   i) depositing a first seed layer having a thickness of about 1000 Å;
   ii) pausing for about 60 seconds; and
   iii) depositing a second seed layer having a thickness of about 1000 Å.

14. The method of claim 13 wherein the first and second seed layers are deposited by:

i) providing about 1 kW DC power to a target;

ii) providing RF power to a coil at between about 2 kW and about 3 kW;

iii) maintaining chamber pressure at about 40 mTorr; and iv) maintaining temperature at about 30° C.

15. The method of claim 1 wherein the first deposition period is between about 10 seconds and about 30 seconds.

16. The method of claim 1 wherein the second period is between about 60 seconds and about 120 seconds.

17. The method of claim 1 wherein the step of reactive precleaning the substrate comprises:

i) introducing a preclean gas mixture comprising between about 0% and about 10% hydrogen and between about 90% and 100% helium into a chamber;

ii) maintaining chamber pressure between about 40 mTorr and 200 mTorr;

iii) providing RF power to a coil between about 300 W and about 600 W at about 1 to 4 MHz; and iv) biasing a substrate support between about 10 W and 100 W.

18. The method of claim 1 wherein the step of depositing a barrier layer comprises:

i) providing between about 1 kW and about 3 kW DC power to a target;

ii) providing RF power to a coil between about 1 kW and about 3 kW;

iii) maintaining chamber pressure between about 5 mTorr and about 100 mTorr; and iv) biasing a substrate support between about 0 W and about 500 W with a bias voltage between about 50 V and about 300 V.

19. The method of claim 1 wherein the step of depositing a seed layer comprises:

i) providing between about 1 kW and about 3 kW DC power to a target;

ii) providing RF power to a coil at between about 1 kW and about 5 kW;

iii) maintaining chamber pressure between about 5 mTorr and about 100 mTorr; and iv) biasing a substrate support between about 0 W and about 500 W with a bias voltage between about 50 V and about 300 V.

20. The method of claim 1 wherein the step of depositing the seed layer comprises:

i) depositing a first seed layer having a thickness of about 1000 Å;

ii) pausing for between about 30 seconds and 120 seconds; and iii) depositing a second seed layer having a thickness of about 1000 Å.

21. The method of claim 20 wherein the first and second seed layers are deposited by:

i) providing about 1 kW DC power to a target;

ii) providing RF power to a coil at between about 2 kW and about 3 kW;

iii) maintaining chamber pressure at about 40 mTorr; and iv) maintaining temperature at about 30° C.

22. The method of claim 21 wherein the chamber pressure and temperature are stabilized for between about 30 seconds and about 120 seconds before the first seed layer is deposited.

23. A method for filling sub-micron features on a substrate, comprising:

a) reactive precleaning the substrate;

b) depositing a barrier layer on the substrate using high density plasma physical vapor deposition;

c) depositing a seed layer over the barrier layer using high density plasma physical vapor deposition; and d) electro-chemically depositing a metal using an electrolyte comprising $CuSO_4$ having a molar concentration between about 0.5 M and about 1.1 M, HCl at a concentration between about 10 ppm and about 1000 ppm, a carrier additive at a concentration between about 5 ml/l and about 40 ml/l, and $H_2SO_4$ having a concentration less than about 0.4 percent, and applying a first current density of between about 1 and 10 $mA/cm^2$ during a first deposition period followed by a second current density of between about 10 and 80 $mA/cm^2$ during a second period.

24. The method of claim 23 wherein the electro-chemically deposited metal is copper.

25. The method of claim 23 wherein the step of reactive precleaning the substrate comprises:

i) introducing a preclean gas mixture comprising between about 0% and about 10% hydrogen and between about 90% and 100% helium into a chamber;

ii) maintaining chamber pressure between about 40 mTorr and 200 mTorr;

iii) providing RF power to a coil between about 300 W and about 600 W at about 1 to 4 MHz; and iv) biasing a substrate support between about 10 W and 100 W.

26. The method of claim 23 wherein the step of depositing a barrier layer comprises:

i) providing between about 1 kW and about 3 kW DC power to a target;

ii) providing RF power to a coil between about 1 kW and about 3 kW;

iii) maintaining chamber pressure between about 5 mTorr and about 100 mTorr; and iv) biasing a substrate support between about 0 W and about 500 W with a bias voltage between about 50 V and about 300 V.

27. The method of claim 23, wherein the step of depositing a seed layer comprises:

i) providing between about 1 kW and about 3 kW DC power to a target;

ii) providing RF power to a coil at between about 1 kW and about 5 kW;

iii) maintaining chamber pressure between about 5 mTorr and about 100 mTorr; and iv) biasing a substrate support between about 0 W and about 500 W with a bias voltage between about 50 V and about 300 V.

28. The method of claim 23 wherein the first deposition period is between about 10 seconds and about 30 seconds.

29. The method of claim 23 wherein the second period is between about 60 seconds and about 120 seconds.

30. The method of claim 23 wherein the first current density is about 2 $mA/cm^2$ and the first period is about 18 seconds.

31. The method of claim 23 wherein the second current density is about 40 $mA/cm^2$ and the second period is about 90 seconds.

32. The method of claim 23 wherein the metal is electro-chemically deposited by flowing the electrolyte between about 2 gpm and about 4.5 gpm.

33. The method of claim 23 wherein the step of depositing the seed layer comprises:

i) depositing a first seed layer having a thickness of about 1000 Å;
   ii) pausing for between about 30 seconds and 120 seconds; and
   iii) depositing a second seed layer having a thickness of about 1000 Å.

34. The method of claim 33 wherein the first and second seed layers are deposited by:

i) providing about 1 kW DC power to a target;
   ii) providing RF power to a coil at between about 2 kW and about 3 kW;
   iii) maintaining chamber pressure at about 40 mTorr; and
   iv) maintaining temperature at about 30° C.

35. The new method of claim 34 wherein the chamber pressure and temperature are stabilized for about 30 seconds and about 120 seconds before the first seed layer is deposited.

* * * * *

UNITED STATES PATENT AND TRADEMARK OFFICE
CERTIFICATE OF CORRECTION

PATENT NO. : 6,436,267 B1
DATED : August 20, 2002
INVENTOR(S) : Carl et al.

It is certified that error appears in the above-identified patent and that said Letters Patent is hereby corrected as shown below:

<u>Column 24,</u>
Line 6, please delete "new".

Signed and Sealed this

Eighteenth Day of May, 2004

JON W. DUDAS
*Acting Director of the United States Patent and Trademark Office*